(12) United States Patent
Satou et al.

(10) Patent No.: US 7,081,766 B2
(45) Date of Patent: Jul. 25, 2006

(54) PROBE CARD FOR EXAMINING SEMICONDUCTOR DEVICES ON SEMICONDUCTOR WAFERS

(75) Inventors: Katsuhiko Satou, Hyogo (JP);
Chikaomi Mori, Hyogo (JP);
Masanari Nakashima, Hyogo (JP)

(73) Assignee: Japan Electronic Materials Corp., Hyogo (JP)

( * ) Notice: Subject to any disclaimer, the term of this patent is extended or adjusted under 35 U.S.C. 154(b) by 0 days.

(21) Appl. No.: 10/870,017

(22) Filed: Jun. 17, 2004

(65) Prior Publication Data

US 2004/0257098 A1 Dec. 23, 2004

(30) Foreign Application Priority Data

Jun. 19, 2003 (JP) ............................. 2003-175462

(51) Int. Cl.
*G01R 31/02* (2006.01)
(52) U.S. Cl. ........................ 324/754; 324/761; 324/762
(58) Field of Classification Search ........ 324/754–755, 324/761–762, 765; 439/66–72, 482, 824
See application file for complete search history.

(56) References Cited

U.S. PATENT DOCUMENTS

| 4,038,599 A | * | 7/1977 | Bove et al. ................. 324/754 |
| 5,821,763 A | * | 10/1998 | Beaman et al. ............. 324/754 |
| 6,483,328 B1 | * | 11/2002 | Eldridge et al. ............ 324/754 |

* cited by examiner

*Primary Examiner*—Vinh P. Nguyen
(74) *Attorney, Agent, or Firm*—Baker & Daniels

(57) ABSTRACT

Probe card for examining semiconductor devices on semiconductor wafers that allows the members configuring the probe card to be easily separated and assembled, prevents the occurrence of electrical conduction failure between electrodes and achieves high electrical contact and high reliability. The probe card is used for measuring electrical properties of a measuring object and includes a space transformer including a plurality of contacts contacting an electrode pad of the measuring object on one surface and a plurality of connecting pins on a surface opposite the surface with the contact, a main substrate including a plurality of first connecting electrodes contacting an electrode pad of measuring equipment, and a sub-substrate including a plurality of through-holes, through which the connecting pin is inserted between the main substrate and the space transformer, for electrically conducting with the first connecting electrode, where the sub-substrate and the main substrate are coupled together.

18 Claims, 10 Drawing Sheets

First Pitch Change    Second Pitch Change

Third Pitch Change

PROBE CARD FOR EXAMINING SEMICONDUCTOR DEVICES ON SEMICONDUCTOR WAFERS

BACKGROUND OF THE INVENTION

1. Field of the Invention

The present invention relates to a probe card for measuring electrical properties of a semiconductor device such as an LSI chip and the like.

2. Description of the Prior Art

A conventional probe card is classified into a horizontal type referred to as a cantilever type and a vertical type referred to as a perpendicular type. The horizontal type probe card is not suitable for simultaneous measurement of a plurality of chips involved in a large-scale high integration of current LSI chips and multiplexing of a tester. The vertical type probe card, on the other hand, is suitable for simultaneous measurement of a plurality of chips since a greater number of probe cards can be used and since the degree of freedom in arranging the probe is high.

In examining the semiconductor device, a plurality of chips needs to be simultaneously measured and probe cards having high electrical contact stability, high performance, and high reliability are required even if the number of electrodes of the probe card used is further increased.

Therefore, the vertical type probe card configured as shown in FIG. 17 has been proposed. In such vertical type probe card, a main substrate 1' including a first main surface 1a' with a plurality of first connecting electrodes 4' arranged on a surface connecting with an electrical pad of a measuring device and a second main surface 1b' with a second connecting electrode 5' conducting with the first connecting electrode via a wire; a space transformer 2' including a second main surface 2b' with a plurality of fifth connecting electrodes 17' connecting to an electrical pad of a measuring object and a first main surface 2a' with a fourth connecting electrode 16' conducting with the fifth connecting electrode 17' via a wire; and a supporting substrate 25 arranged between the main substrate 1' and the space transformer 2' are provided. Further, a connecting pin 7' lying across the supporting substrate and bent in an arched shape is provided, where one tip of the connecting pin 7' contacts the second connecting electrode 5' of the main substrate 1' and the other tip contacts the fourth connecting electrode 16' of the space transformer 2'.

However, in this type of probe card configured with the main substrate 1', the space transformer 2', the connecting pin 7' conducting the opposing electrodes of the main substrate and the space transformer, and the supporting substrate supporting the connecting pin 7', there are at least two points for electrical bias contact, the point of the second main surface of the main substrate 1' and the tip of the connecting pin 7' and the point of the first main surface of the space transformer 2' and the other tip of the connecting pin 7', and thus, conduction failure tends to occur as a whole. Further, since the connecting pin 7' formed in a bent state tends to be long and is supported by the supporting substrate in a state having unequal direction, inclination and the like, the position of the tip of the connecting pin 7' becomes inaccurate, and a greater number of conduction failures occur.

SUMMARY OF THE INVENTION

The present invention thus aims to propose a probe card for preventing the occurrence of conduction failure between electrodes, and having a high electrical contact stability and high reliability to solve the above mentioned problems of the conventional probe card.

To achieve the above mentioned aim, the probe card according to the present invention for measuring the electrical properties of the measuring object includes a main substrate with a first connecting electrode contacting the measuring equipment, a sub-substrate, coupled to the main substrate, with a plurality of through-holes electrically conducting with the first connecting electrode, and a space transformer including, on one main surface, a connecting pin removably inserted through the through hole and, on the other main surface, a plurality of contacts electrically conducting with the connecting pin and contacting the measuring object.

The sub-substrate and the space transformer are removably attached. Further, the main substrate includes a first main surface with a first connecting electrode and a second main surface with a second connecting electrode conducting with the first connecting electrode via a wire, and an electrical conductor for electrical connection is provided between the second main surface and a first main surface, facing towards the second main surface, of the sub-substrate including the through hole.

The main substrate includes, on the first main surface with the first connecting electrode, a reinforcing plate, for preventing a distortion of the main substrate. A connecting pin and the through-hole of the sub-substrate, through which the connecting pin is inserted, elastically contact in the throughhole. The probe card of the present invention is further configured with a main substrate having a first connecting electrode contacting a measuring equipment, a sub-substrate, coupled to the main substrate, with a plurality of through-holes electrically conducting with the first connecting electrode, a space transformer with a plurality of contacts contacting the measuring object on one main surface and including a plurality of through-holes electrically conducting with the contact, and a connecting pin with one end removably arranged in the through-hole of the space transformer and the other end removably arranged in the throughhole of the sub-substrate. The space transformer may be divided into a plurality of divided parts.

DESCRIPTION OF THE PREFERRED EMBODIMENTS

The preferred embodiments of the invention will now be explained with reference to the accompanying drawings.

Figure 1:
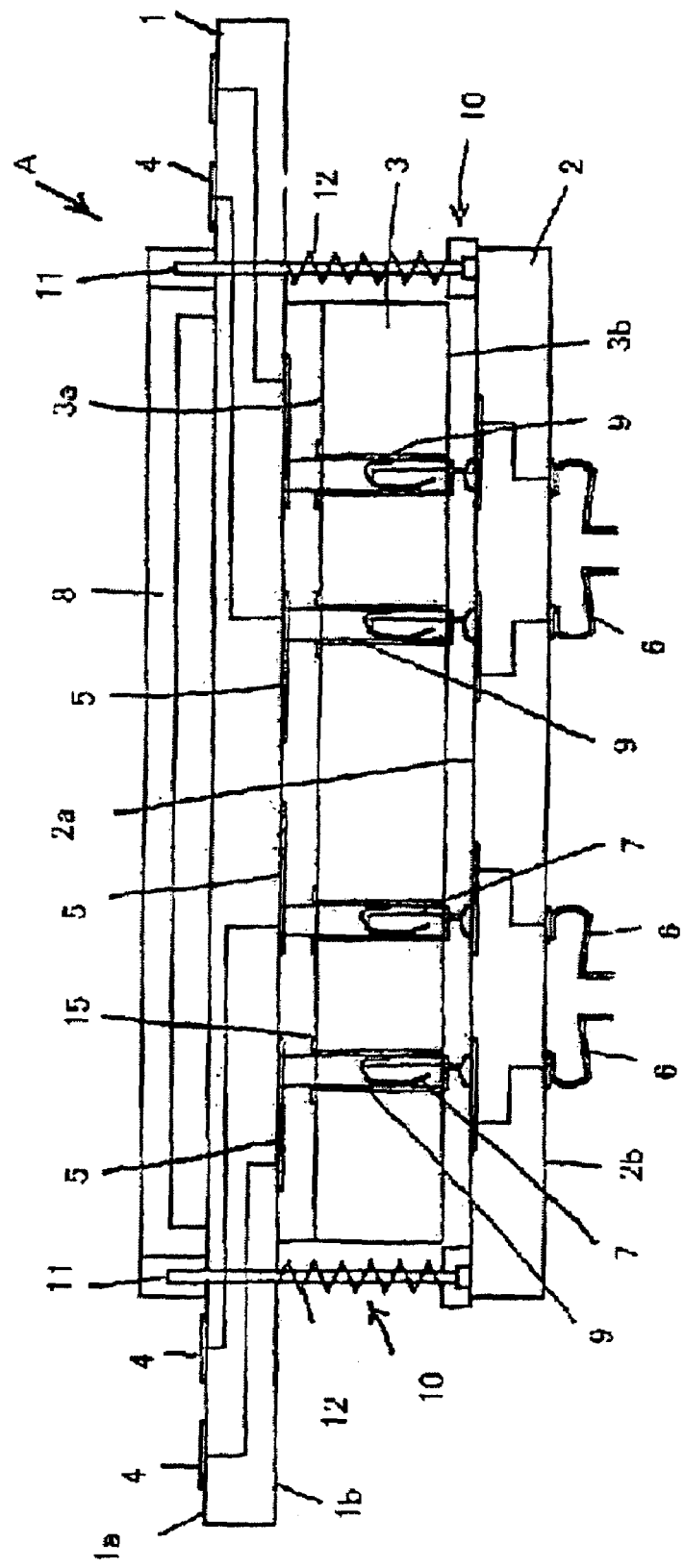
FIG. 1 is a schematic view of a cross sectional configuration according to one preferred embodiment of the present invention.
Figure 2:
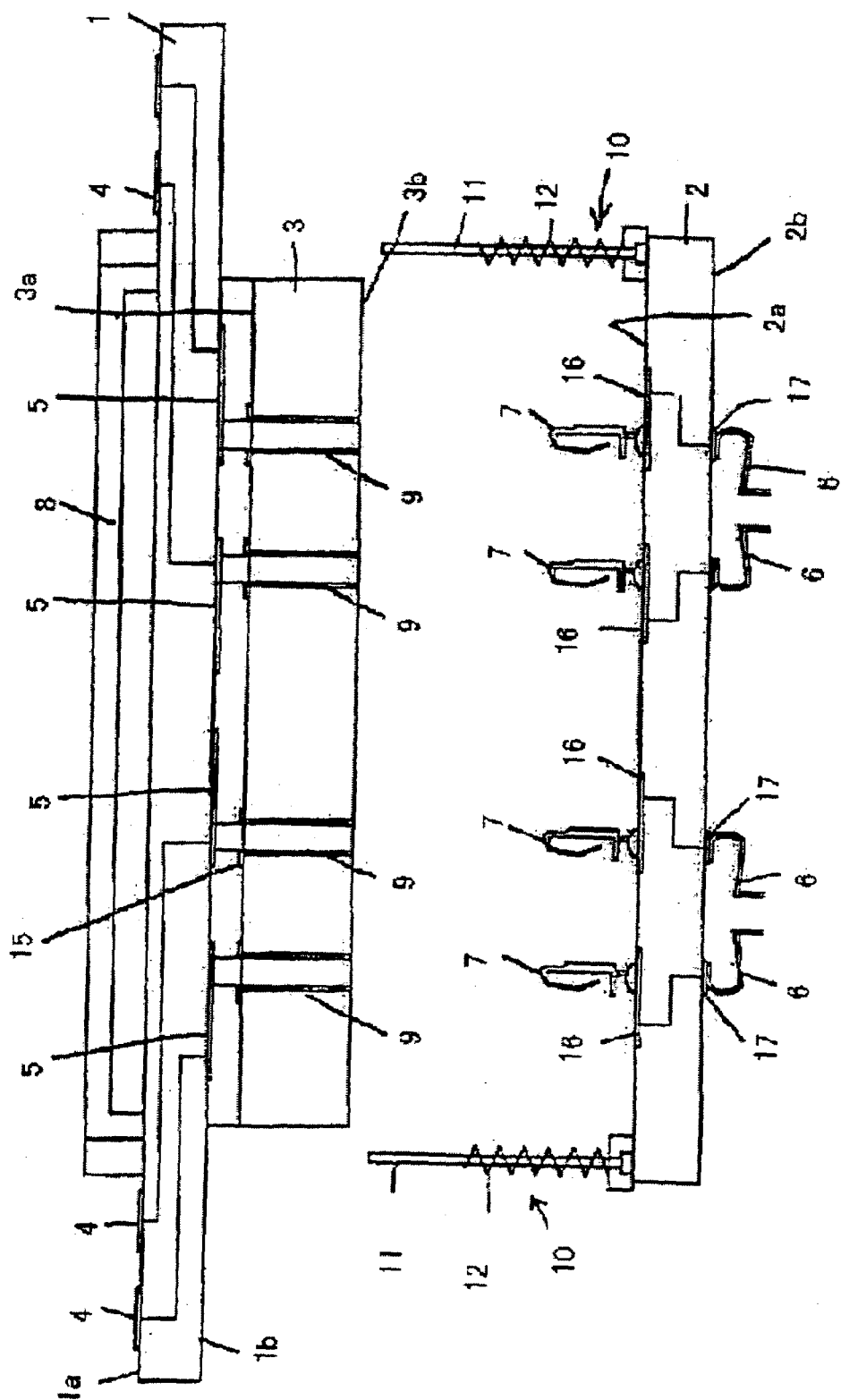
FIG. 2 is an exploded schematic view of the cross sectional configuration according to the embodiment of the present invention.
Figure 3:
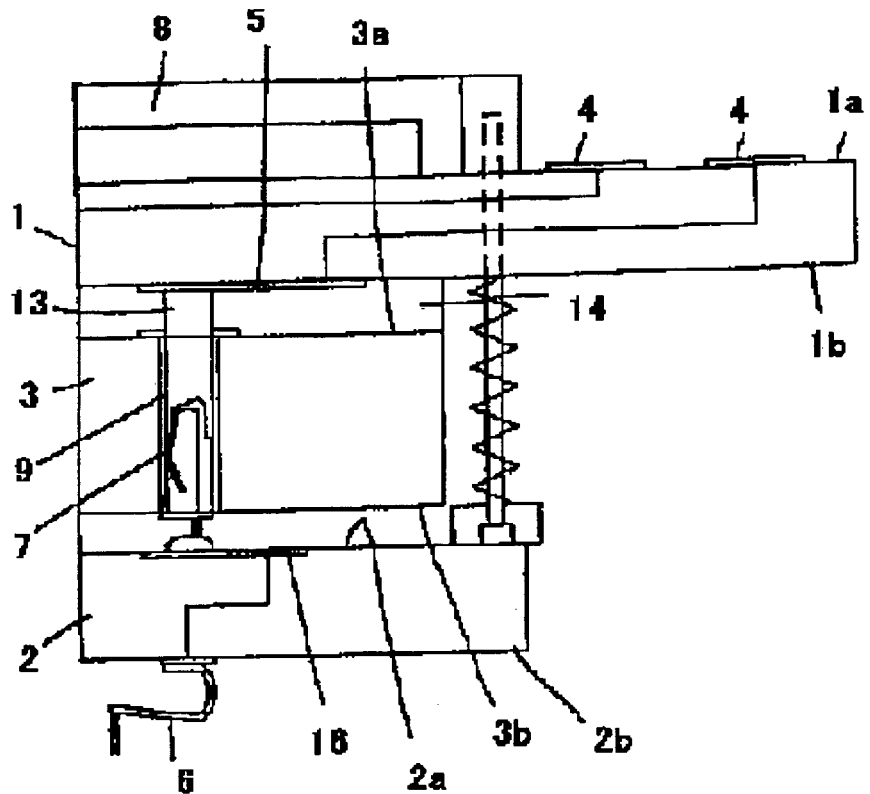
FIG. 3 is a partial schematic view of the cross sectional configuration according to the embodiment of the present invention.

As shown in FIGS. 1 to 3, a probe card A has a main substrate 1 including a first connecting electrode 4 contacting a measuring equipment for examination such as a tester (not shown), a sub-substrate 3 including a plurality of through-holes 9 electrically conducting with the first connecting electrode, a connecting pin 7 removably inserted through the through-hole 9, a space transformer 2 including the connecting pin 7 on one main surface 2a and a plurality of contacts 6 contacting a semiconductor device (not shown) serving as a measuring object such as an IC chip on the other main surface 2b, and a holder 10 for removably attaching the space transformer 2 to the main substrate 1.

The main substrate 1 includes, as shown in FIGS. 1 to 3, a plurality of first contacting electrodes 4, 4 on a first main surface 1a for electrically conducting with the measuring equipment for examination, and a plurality of second connecting electrodes 5, 5 on a second main surface 1b for electrically conducting with the sub-substrate 3, to be hereinafter described. The second connecting electrode 5 electrically conducts with the first connecting electrode 4 via a wire in the main substrate.

In the main substrate 1, the spacing between electrodes changes from the narrow spacing of adjacent second connecting electrodes of the second main surface 1b to the wide spacing of adjacent first connecting electrodes of the first main surface 1a. The first connecting electrodes of the first main surface 1a are arranged with a wide spacing that corresponds to the spacing between the electrodes of the measuring equipment.

The main substrate 1 includes a reinforcing plate 8 on the first main surface 1a. The reinforcing plate 8 is provided to solve the problem of the main substrate 1 absorbing heat, generated by the instability of the electrical contact caused by changes in contact pressure of the measuring equipment contacting the first main surface 1a of the main substrate 1, thus deforming the main substrate 1 to a curved shape as a result of the thermal expansion difference of the main substrate 1, and causing electrical conduction failure.

Figure 16:
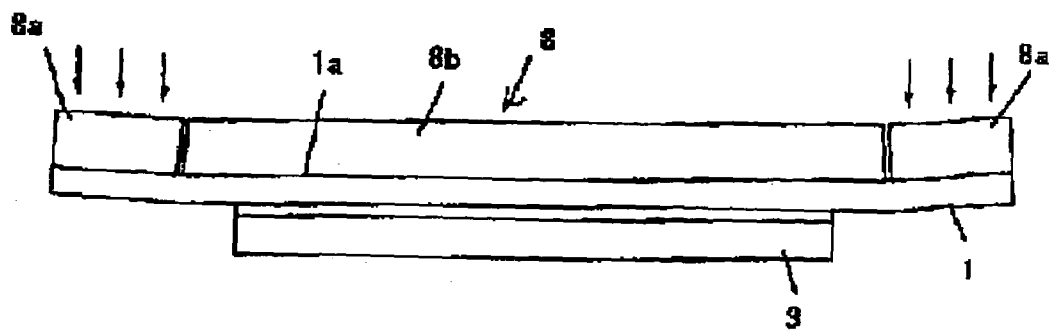
FIG. 16 is a partial schematic view showing another reinforcing plate according to the embodiment of the present invention.
Figure 17:
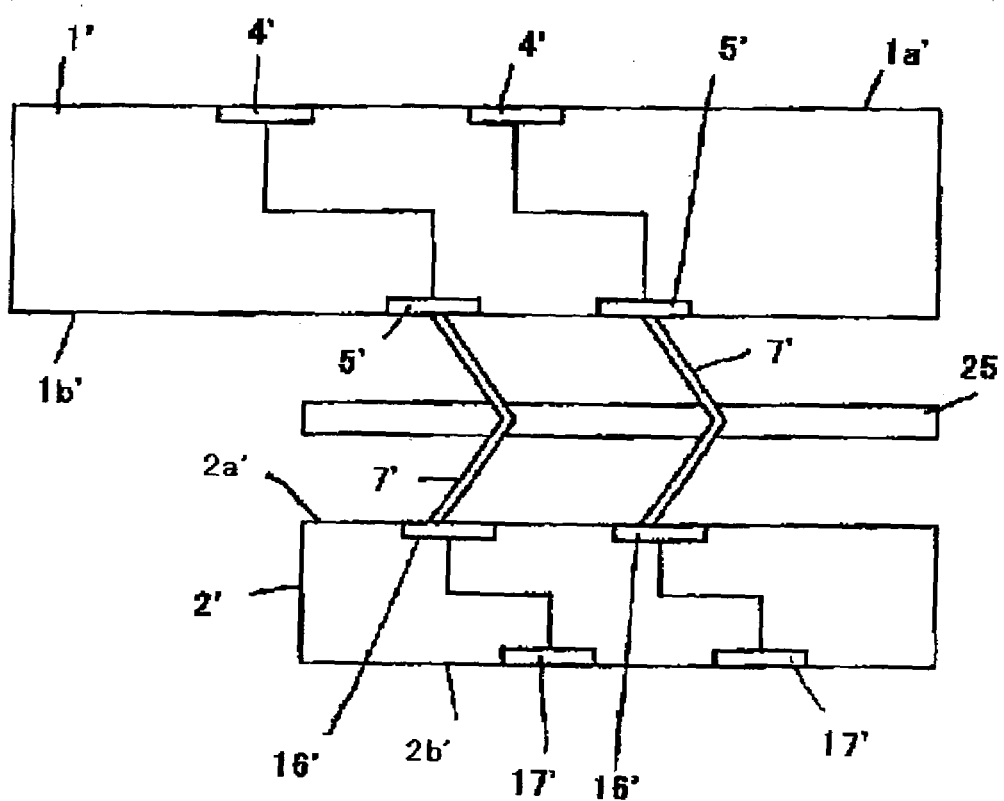
FIG. 17 is a schematic view showing one part of a cross sectional configuration of a probe card according to the prior art.

The reinforcing plate 8 is expected to suppress the distortion of the main substrate 1 as much as possible. As shown in FIG. 16, a plurality of independent members 8a and 8b are arranged on the first main surface 1a of the main substrate 1, allowing the central part of the main substrate 1 to be held flat even if the edges of the main substrate 1 distort. Further, a plurality of independent members of different materials may be provided to prevent the distortion of the main substrate 1 more efficiently.

The sub-substrate 3 includes, as shown in FIGS. 1 to 3, a first main surface 3a facing towards the second main surface 1b of the main substrate 1, and a second main surface 3b facing towards the first main surface 2a of the space transformer 2 to be hereinafter described. A plurality of through-holes 9, 9 is included between the first main surface 3a and the second main surface 3b.

The through-hole 9, including an electrically conductive plated layer, runs between the first main surface 3a and the second main surface 3b, and electrically conducts with a third connecting electrode 15 on the first main surface 3a.

The third connecting electrode 15 of the sub-substrate 3 and the second connecting electrode 5 of the main substrate 1 are fixed with an electrical conductor 13 made of, for example, a solder and an electrically conductive resin. A resin member 14 for substrate adhesion is included between the second main surface 1b of the main substrate 1 and the first main surface 3a of the sub-substrate 3 facing towards the second main surface of the main substrate, except for the region including the electrical conductor. The sub-substrate 3 is electrically conducted with and integrally coupled to the main substrate 1.

As shown in FIGS. 1 to 3, the space transformer 2 includes the first main surface 2a facing towards the second main surface 3b of the sub-substrate 3 and the second main surface 2b with a plurality of contacts 6, 6 for contacting an electrode pad (not shown), arranged in high density, of the semiconductor device.

A plurality of fourth connecting electrodes 16, 16 are arranged on the first main surface 2a of the space transformer 2 and the connecting pin 7, to be hereinafter described, is soldered to the fourth connecting electrode 16. A plurality of fifth connecting electrodes 17, 17 are arranged on the second main surface 2b of the space transformer 2 and the contact 6 is soldered to the fifth connecting electrode 17.

The fourth connecting electrode 16 of the space transformer 2 electrically conducts with the fifth connecting electrode 17 via the wire in the space transformer 2.

The spacing between a plurality of adjacent contacts 6 of the space transformer 2 corresponds to the narrow spacing of the electrode pad (not shown) of the semiconductor device.

The space transformer 2 may be a divided type, allowing the defective part, for example, with electrical conduction failure to be immediately repaired and replaced with the divided type, as hereinafter described with FIG. 15.

The connecting pin 7 included in the space transformer 2 is removably inserted through the through-hole 9 of the sub-substrate 3. One end of the connecting pin 7 elastically contacts the through-hole 9, 24, including the electrically conductive plated layer, and electrically conducts therewith, as shown in FIGS. 6 to 8 and FIGS. 10, 12, and 13, as described hereinafter. The other end of the connecting pin 7 is not soldered to the space transformer 2 and may elastically contact with the space transformer, as shown in FIG. 11 described hereinafter.

Figure 9:
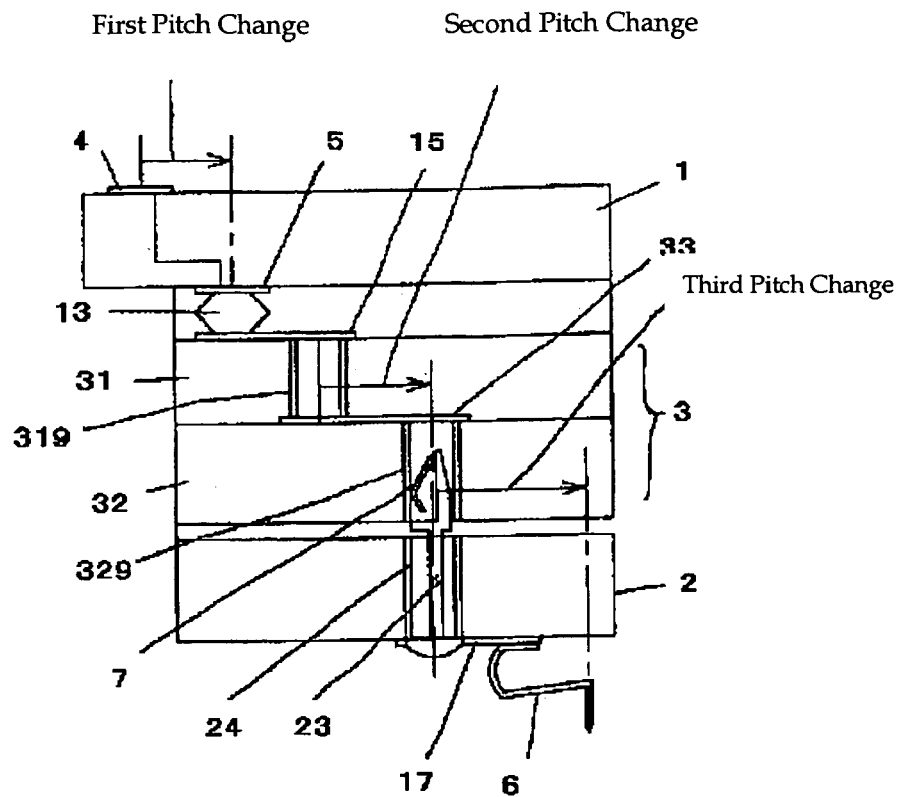
FIG. 9 is a schematic view showing another embodiment of a sub-substrate of the present invention.

In another embodiment of the sub-substrate 3, as shown in FIG. 9, the sub-substrate 3 consists of two layers, a first sub-substrate 31 and a second sub-substrate 32. A first sub-substrate through-hole 319 and a second sub-substrate through-hole 329 are provided in the sub-substrates 31 and 32, respectively, at positions shifted with respect to each other. The first sub-substrate through-hole 319 and the second sub-substrate through-hole 329 electrically conduct with the sixth connecting electrode 33.

The first sub-substrate through-hole 319 electrically conducts with the third connecting electrode 15 of the sub-substrate 3, and the third connecting electrode 15 is electrically conducting with and fixed to the second connecting electrode 5 of the main substrate 1 with the electrical conductor 13 made of, for example, a solder and an electrically conductive resin. The second connecting electrode 5 electrically conducts with the first connecting electrode 4 via the wire in the main substrate 1.

The fifth connecting electrode 17 is arranged on the second main surface 2b of the space transformer 2 and the contact 6 is soldered to the fifth connecting electrode 17. A terminal portion 23 of the connecting pin 7, to be hereinafter described, electrically connected in the second sub-substrate through-hole 329 passes through the through-hole 24 in the space transformer 2 and is soldered to the fifth connecting electrode 17. The sub-substrate 3 consists of two layers of the first sub-substrate 31 and the second sub-substrate 32 but may also consist of a plurality of layers of three or more layers.

By configuring the sub-substrate 3 with two or more layers and shifting the positions of the through-holes in each of the sub-substrate, when the spacing changes between the first connecting electrode 4 of the main substrate 1 and the contact 6 of the space transformer 2, the spacing within the sub-substrate 3 can be changed in two steps of a second pitch change and a third pitch change. The concentration of wires in the main substrate 1 can thus be distributed in the sub-substrate compared to when the spacing is changed directly through one through-hole from the main substrate 1. This reduces the wiring load of the main substrate 1.

As shown in FIG. 1, the holder 10 for removably attaching the space transformer 2 to the main substrate 1 includes a screw 11 spirally attached to the main substrate 1, and springs 12, 12 for suppressing the distortion of the space transformer 2. The spring 12 functions to solve the problem of the space transformer 2 absorbing heat, generated from the instability of the electrical contact caused by the change in contact pressure on the contact 6 contacting the electrode pad (not shown) of the measuring object, thus deforming the space transformer 2 to a curved shape by the thermal expansion difference of the space transformer 2, and causing electrical conduction failure.

By turning a screw head of the screw 11 from the space transformer 2 side to remove from the main substrate 1, the main substrate 1 integrally coupled with the sub-substrate 3 and the space transformer 2 can be easily separated and the defected connecting pin and the like of the space transformer 2 can be replaced. Conversely, by turning the screw 11 in the reverse direction, the space transformer 2 and the main substrate 1 can be easily assembled.

The coupling of the main substrate 1 and the sub-substrate 3 will now be explained with reference to FIGS. 4 and 5.

Figure 4:
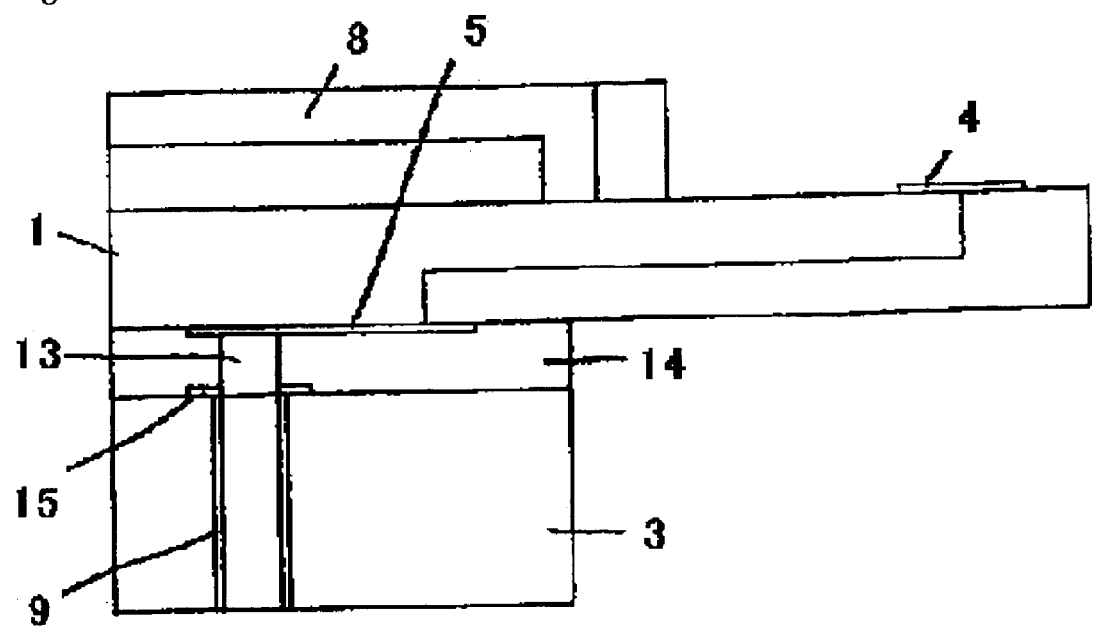
FIG. 4 is a partial schematic view showing a coupling state of a main substrate and a sub-substrate according to the embodiment of the present invention.

As shown in FIG. 4, the main substrate 1 and the sub-substrate 3 are integrally coupled by fixing the third connecting electrode 15 of the first main surface 3a electrically conducting with the through-hole 9, including the electrically conductive plated layer, of the sub-substrate 3 and the second connecting electrode 5 of the second main surface 1b of the main substrate 1, with the electrical conductor 13 made of, for example, the solder and the electrically conductive resin and the like, and arranging the resin member 14 for substrate adhesion between the sub-substrate and the main substrate 1, except for the region with electrical conductor.

Therefore, in the coupling of the main substrate 1 and the sub-substrate 3, the electrically conductive region in which the spacing between electrodes changes from the narrow spacing of adjacent electrodes of the first main surface 3a of the sub-substrate 3 to the wide spacing of the adjacent electrodes of the first main surface 3a of the main substrate 1 is defined by the main substrate 1 and the sub-substrate 3, and thus the electrical conduction failure is prevented, allowing better contact stability and reduction in the number of electrical bias contact points.

Figure 5:
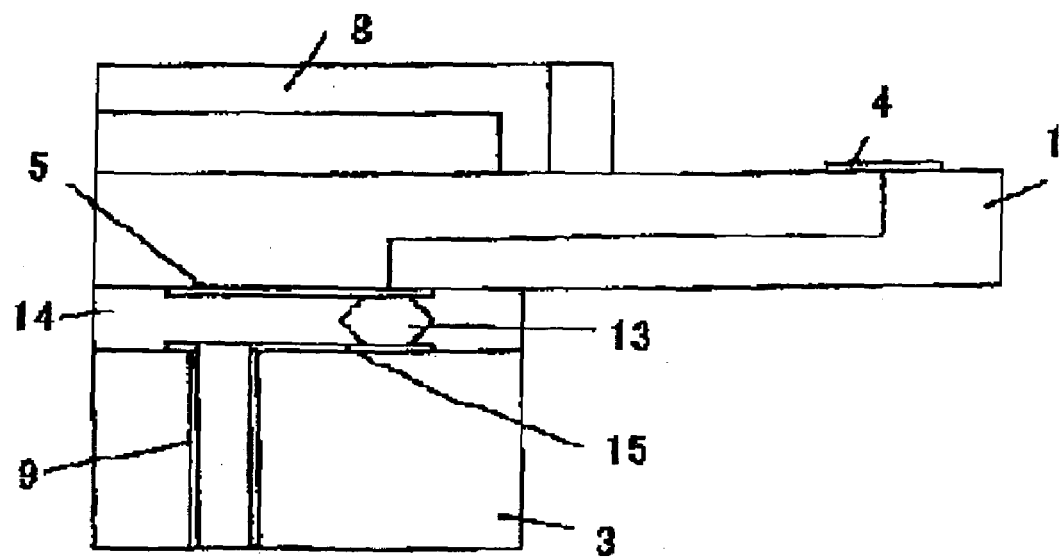
FIG. 5 is a partial schematic view showing another coupling state of the main substrate and the sub-substrate according to the embodiment of the present invention.

As shown in FIG. 5, the third connecting electrode 15 of the first main surface 3a electrically conducting with the through-hole 9, including the electrically conductive plated layer, of the sub-substrate 3 and the second connecting electrode 5 of the second main surface 1b of the main substrate 1 may be fixed at a position away from the position of the through-hole of the sub-substrate 3 with the electrical conductor 13.

Figure 6:
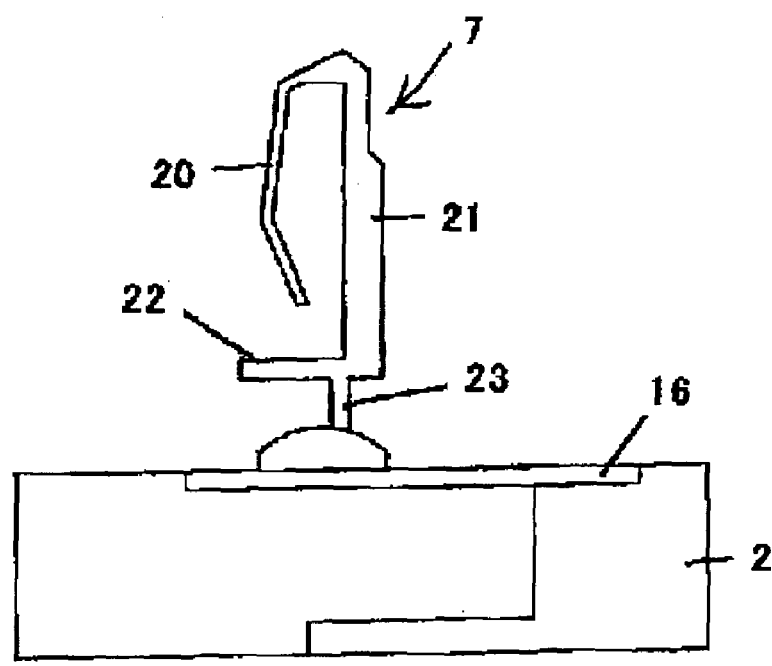
FIG. 6 is an enlarged view showing a connecting pin according to the embodiment of the present invention.

The connecting pin 7 is formed into a U-shape or a V-shape by, for example, etching and press work. As shown in FIG. 6, the connecting pin 7 includes a contacting portion 20 for carrying out elastic contact in the through-hole 9 of the sub-substrate 3, a supporting portion 21 for supporting the contacting portion, a stopper portion 22, provided at the end of the supporting portion, for regulating the supporting portion from entering too far into the through-hole 9, and a terminal portion 23 soldered to the fourth connecting electrode 16 of the space transformer 2.

As shown in FIG. 3, when the contacting portion 20 and the supporting portion 21 are inserted through the through-hole 9 of the sub-substrate 3, the contacting portion 20 contacts the inner wall of the through-hole, including the electrically conductive plated layer, and the connecting pin 7 becomes electrically conductive. It is apparent that when the space transformer 2 is pulled down, the contacting portion and the supporting portion of the connecting pin 7 are pulled out of the through-hole 9.

Figure 7:
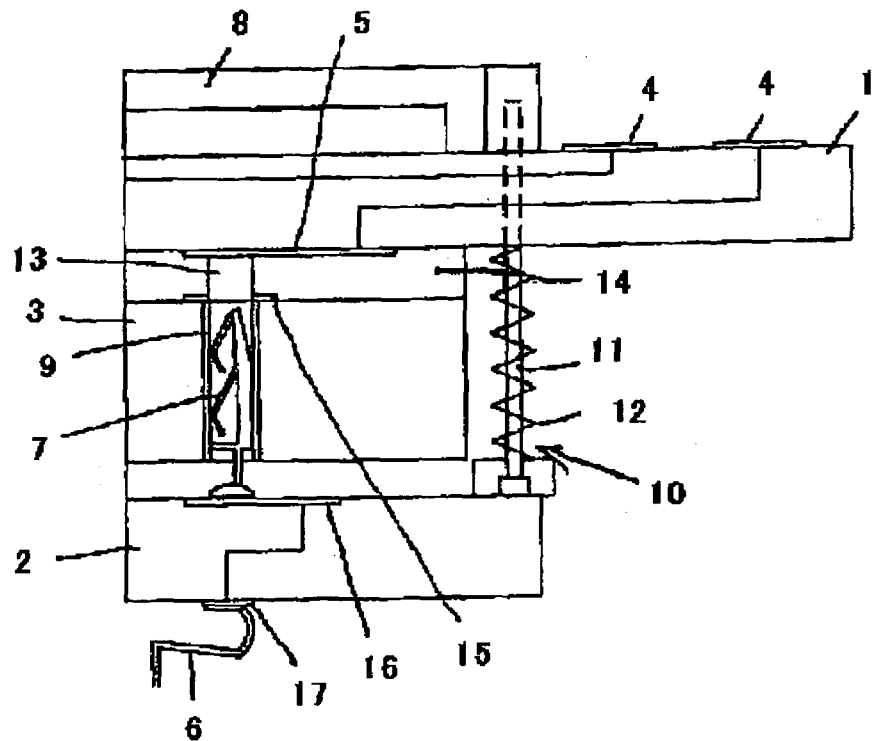
FIG. 7 is a partial schematic view showing a connecting state of another connecting pin according to the embodiment of the present invention.

FIG. 7 shows the contacting portion 20 of the connecting pin 7 divided and configured in two steps, in which case, the elastic contact in the through-hole 9 of the sub-substrate 3 becomes stronger and the durability becomes more satisfactory than the above mentioned contacting portion.

Figure 8:
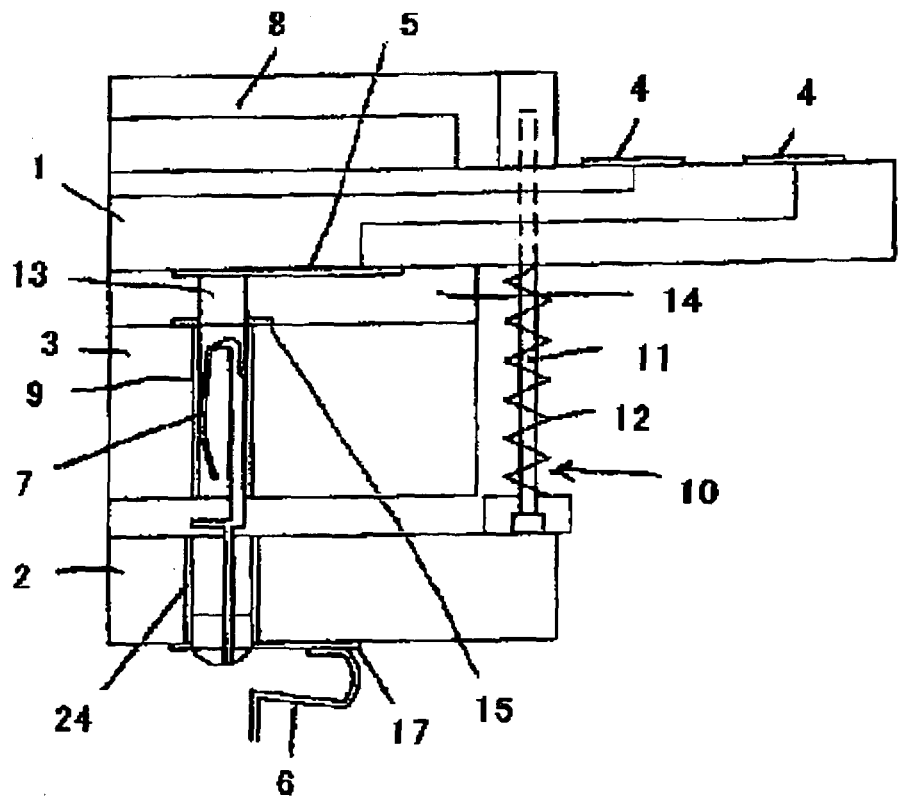
FIG. 8 is a partial schematic view showing a coupling state of the connecting pin according to the embodiment of the present invention.

FIG. 8 shows the terminal portion 23 of the connecting pin 7 in a fixed configuration, in which case, the terminal portion of the connecting pin 7 is inserted through the through-hole 24 provided in the space transformer 2, and is soldered to the fifth connecting electrode 17 of the space transformer 2, allowing good electrical conductivity and stronger fixation of the connecting pin 7.

Figure 10:
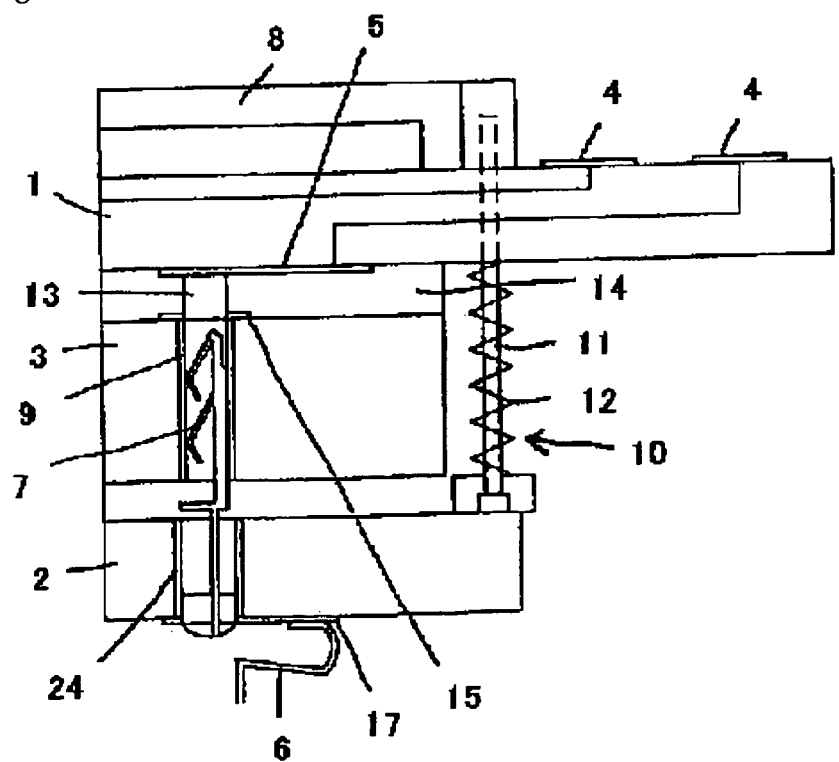
FIG. 10 is a partial schematic view showing a coupling state of another connecting pin according to the embodiment of the present invention.
Figure 11:
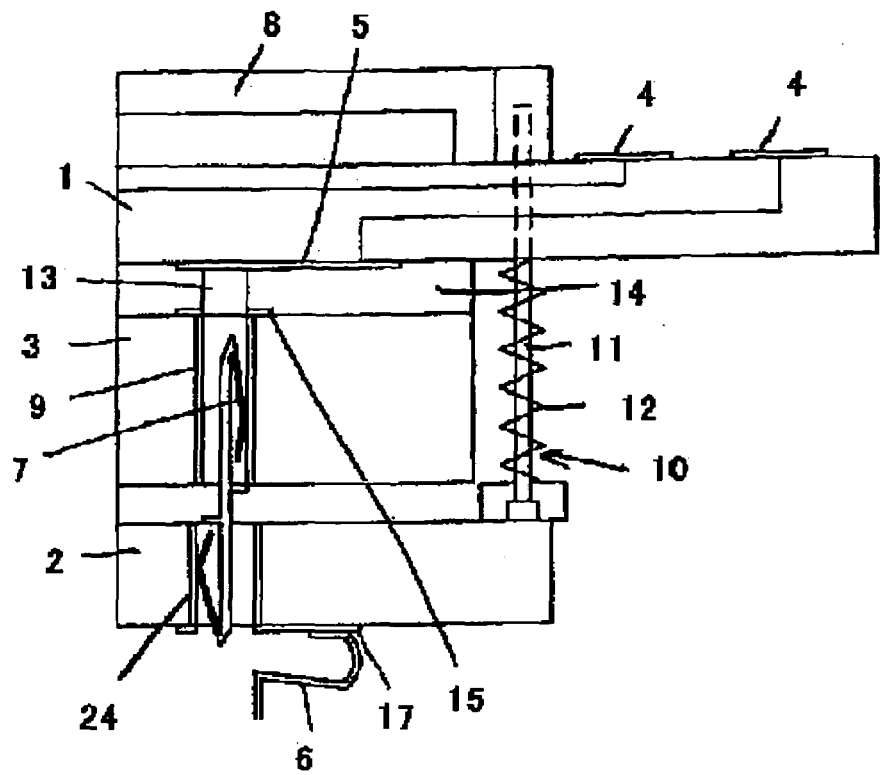
FIG. 11 is a partial schematic view showing a coupling state of another connecting pin according to the embodiment of the present invention.

FIG. 10 shows the contacting portion 20 of the connecting pin 7 divided in two steps and similar to FIG. 8, the terminal portion 23 thereof is inserted through the through-hole 24 provided in the space transformer 2, and soldered to the fifth connecting electrode 17 of the space transformer 2, allowing good electrical conductivity and stronger fixation of the connecting pin 7.

FIG. 11 shows a configuration in which, in addition to the contacting portion 20 of the connecting pin 7, the terminal portion 23 also carries out elastic contact. Similar to FIG. 3, the contacting portion 20 and the supporting portion 21 of the connecting pin 7 are inserted through the through-hole 9 of the sub-substrate 3, allowing elastic contact of the contacting portion in the through-hole 9. Furthermore, the terminal portion 23 is inserted through the through-hole 24 of the space transformer 2 to elastically contact the inner wall of the through-hole 24. Thus, there is no need to solder the space transformer 2 and the connecting pin 7 and thus the space transformer 2 and the connecting pin 7 can be easily separated.

In this case, by creating a difference between the spring pressure of the contacting portion 20 of the connecting pin 7 on the sub-substrate 3 side and the spring pressure of the terminal portion of the connecting pin 7 with the through-hole 24 in the space transformer 2, a member to remain the connecting pin 7 with can be selected when removing the space transformer 2 from the sub-substrate 3. That is, by creating the spring pressure on the sub-substrate 3 side greater than the spring pressure on the space transformer 2 side, the connecting pin 7 reliably remains on the sub-substrate 3 side during the removal of the space transformer 2 and the connecting pin 7 will not fall out from neither the through-holes 9 of the sub-substrate 3 nor the through-hole 24 of the space transformer 2. (By setting the spring pressure on the space transformer 2 side greater, the connecting pin 7 remains on the space transformer 2 side.)

Figure 12:
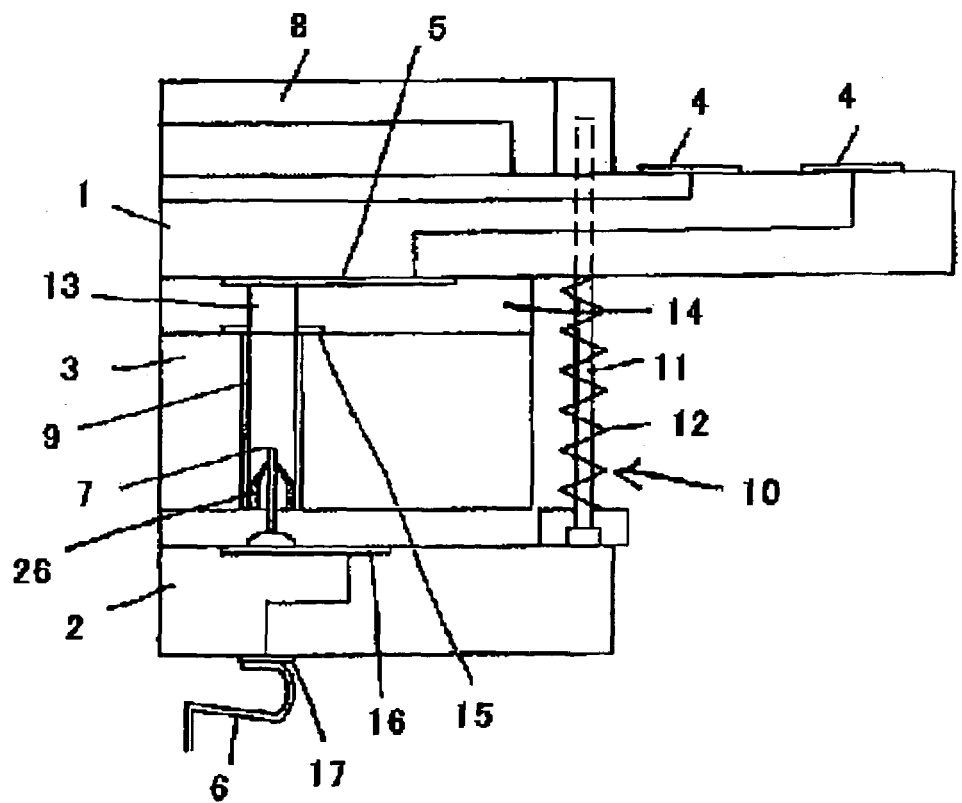
FIG. 12 is a partial schematic view showing a connecting state of another connecting pin according to the embodiment of the present invention.
Figure 13:
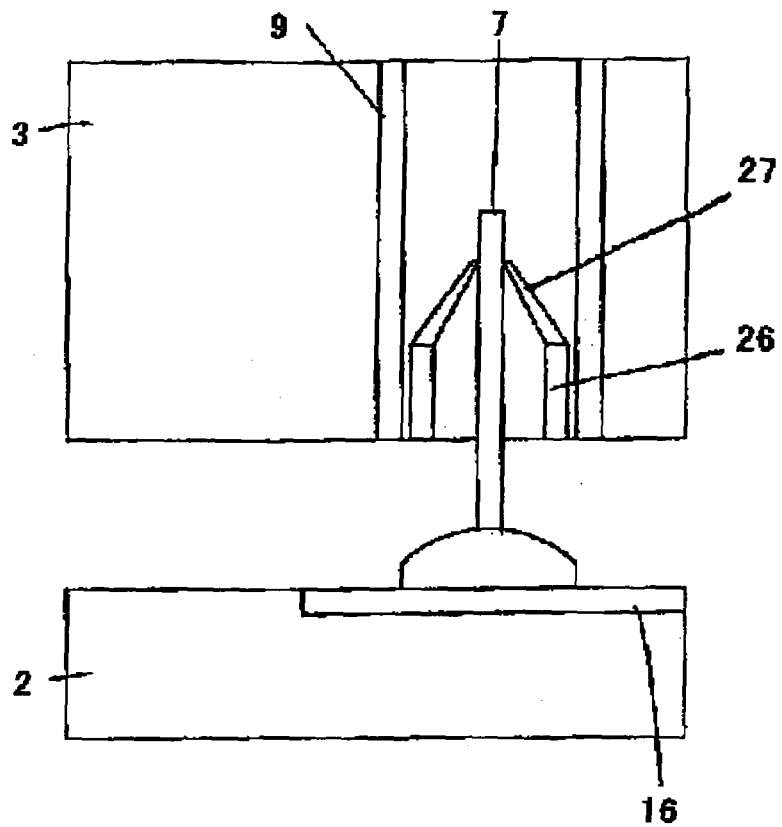
FIG. 13 is a partially enlarged view showing a coupling state of the connecting pin according to the embodiment of the present invention.

FIGS. 12 and 13 show the connecting pin 7 configured as a straight pin. Here, a tapered inner contact 26 is arranged in the through-hole 9 of the sub-substrate 3. When passing through the inner contact 26, the tip of the connecting pin 7 elastically contacts the tip end 27 of the inner contact 26. The through-hole 9, including the electrically conductive plated layer, and the inner contact 26 are electrically conductive. The connection of the straight pin serving as the connecting pin and the inner contact 26 has good electrical conductivity and the in/out of the straight pin serving as the connecting pin can be smoothly carried out.

Figure 14:
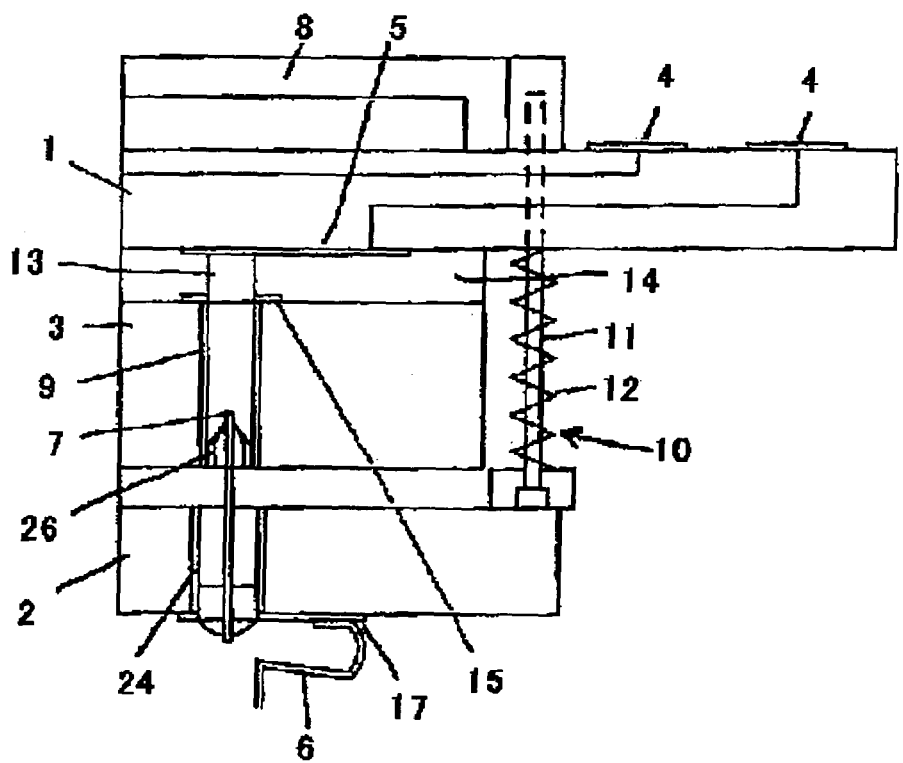
FIG. 14 is a partial schematic view showing a coupling state of the connecting pin according to the embodiment of the present invention.

Furthermore, FIG. 14 shows a connection between the connecting pin 7 or the straight pin, similar to FIG. 12, and the inner contact 26. The fixation of the straight pin is such that the straight pin is inserted through the through-hole 24 provided in the space transformer 2 and soldered to the fifth connecting electrode 17 of the space transformer 2, thus allowing good electrical conductivity and stronger fixation of the connecting pin 7.

Figure 15:
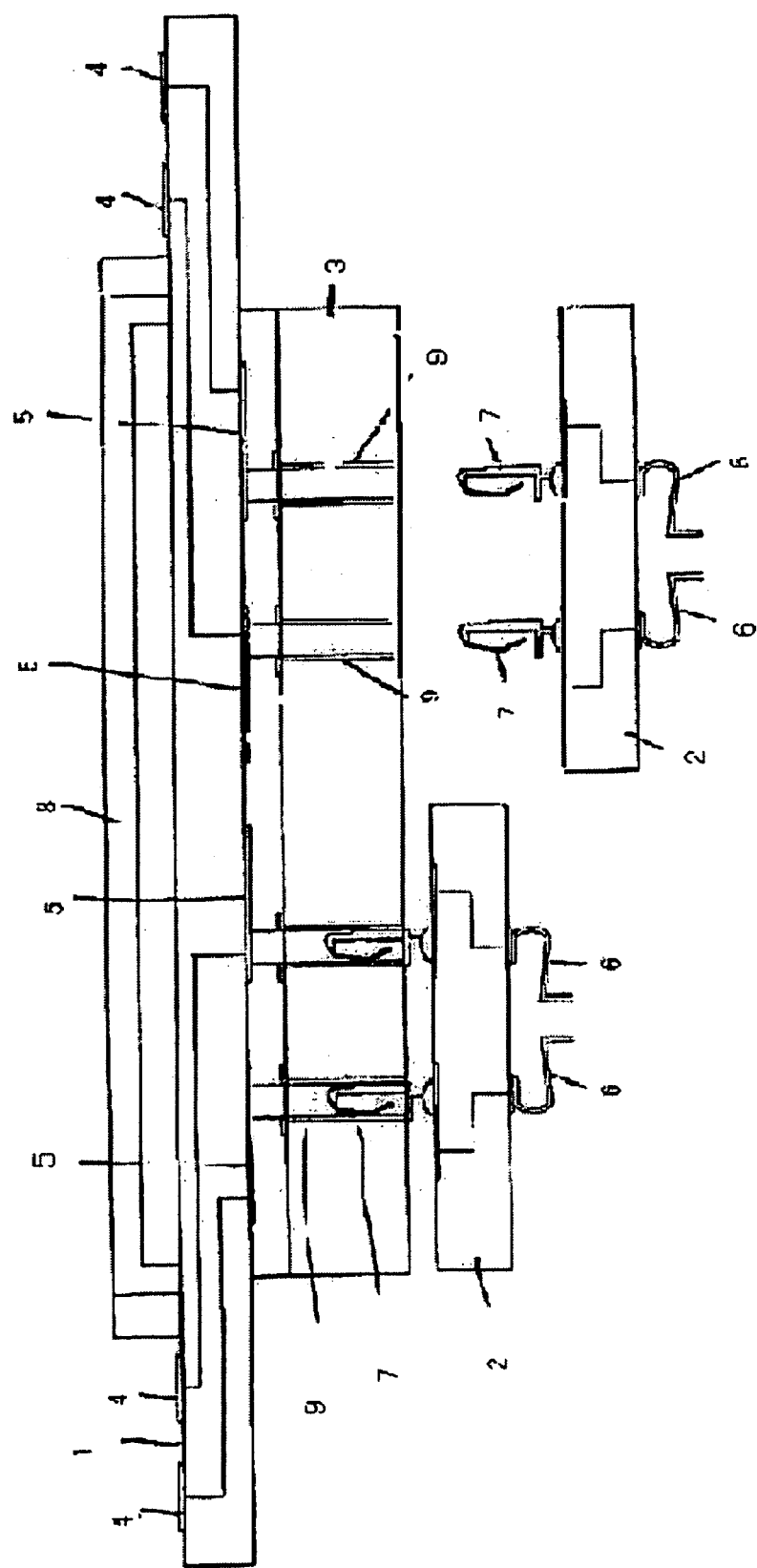
FIG. 15 is a schematic view of a cross sectional configuration according to another embodiment of the present invention.

FIG. 15 shows another embodiment of the present invention in which the space transformer 2 is a divided type. The sub-substrate 3 is integrally coupled to the main substrate 1, and the space transformer 2 including the connecting pin 7 to be inserted through the through-hole 9 of the sub-substrate 3 is divided into a plurality of divided parts.

With such division of the space transformer 2, the defected part, for example, with electrical conduction failure can be immediately repaired and replaced with the divided part, and at the same time, the distortion of the divided part of the divided space transformer 2 becomes small, thus increasing the reliability in measuring a plurality of semiconductor devices.

The above description is based on the embodiments considered as an exemplary embodiment of the present invention, but the present invention is not limited to the configuration thereof, and various changes and modifications including the components disclosed in the present invention and achieving the aim of the present invention may be appropriately made without departing from the scope of the present invention having the advantages described below.

As apparent from the above description, the probe card according to the present invention has a main substrate with a first connecting electrode contacting a measuring equipment, a sub-substrate, coupled to the main substrate, with a plurality of through-holes electrically conducting with the first connecting electrode, and a space transformer including a connecting pin removably inserted through the through-hole on one main surface and a plurality of contacts electrically conducting with the connecting pin and contacting the measuring object on the other main surface. The conductive region in which the spacing between electrodes changes from a narrow spacing of adjacent electrodes to a relatively wide spacing of adjacent electrodes is defined by the main substrate and the sub-substrate, and thus there is no longer a need to be concerned about the electrical conduction failure between the main substrate and the sub-substrate in each examination and only the electrical conductivity by the contact of the main substrate and the connecting pin of the space transformer needs to be taken into consideration. Thus, high reliability, easy recognition of conduction failure, and easy maintenance are achieved.

Further, the sub-substrate and the space transformer are removably attached, thus allowing the connecting pin arranged in the space transformer that is, for example, defected to be replaced.

The main substrate includes a first main surface with a first connecting electrode and a second main surface with a second connecting electrode conducting with the first connecting electrode via a wire, and an electrical conductor for electrical connection is provided between the second main surface and a first main surface, facing towards the second main surface of the main substrate, of the sub-substrate including a through-hole. The electrically conductive region in which the spacing between electrodes changes from a narrow spacing of adjacent electrodes of the first main surface of the sub-substrate to a wide spacing of adjacent electrodes of the first main surface of the main substrate is defined by the main substrate and the sub-substrate, and thus the electrical conduction failure is suppressed, allowing better contact stability and reduction in the number of electrical bias contact points.

The main substrate includes, on the first main surface with the first connecting electrode, a reinforcing plate for preventing the distortion of the main substrate and thus the problem of the main substrate deforming in a curved shape and causing electrical conduction failure and instability of electrical contact is solved.

The connecting pin and the through-hole of the sub-substrate through which the connecting pin is inserted are configured to elastically contact in the through-hole, and thus the connection is strong and the conduction failure is prevented.

The probe card according to the present invention is further configured with a main substrate including the first connecting electrode contacting the measuring equipment, a sub-substrate, coupled to the main substrate, with a plurality of through-holes electrically conducting with the first connecting electrode, a space transformer with a plurality of contacts contacting the measuring object on one main surface and including a plurality of through-holes electrically conducting with the contact, and a connecting pin with one end removably arranged within the through-hole of the space transformer and the other end removably arranged within the through-hole of the sub-substrate, and thus the connection is strong and the conduction failure is suppressed.

Further, the space transformer is divided into a plurality of divided parts, and thus there is no need to replace the entire space transformer for a partial defect of the space transformer and can be performed by replacing in units of divided parts. Thus, a significant effect such as great cost reduction is achieved.

What is claimed is:

1. A probe card for examining semiconductor devices, comprising:
    a main substrate including first connecting electrodes adapted to be connected to a measuring device;
    a sub-substrate, coupled to the main substrate, including a plurality of through-holes electrically connected with respective said first connecting electrodes;
    a space transformer including a plurality of contacts adapted to contact a measuring object on one surface and including a plurality of through-holes for electrically conducting with the contacts; and
    a connecting pin with one end removably arranged in each of said through holes of the space transformer, and the other end removably arranged in a said through-hole of the sub-substrate.

2. The probe card according to claim 1, wherein
    the main substrate comprises a first main surface with the first connecting electrodes, and a second main surface with a second connecting electrodes electrically connected with the first connecting electrodes via wires; and
    an electrical conductor for electrical connection is provided between the second main surface and a first main surface, of the sub-substrate including the through-holes, said first main surface of the sub-substrate facing toward the second main surface of the main substrate.

3. The probe card according to claim 1, wherein a first main surface with the first connecting electrodes of the main substrate includes a reinforcing plate for preventing the distortion of the main substrate.

4. The probe card according to claim 1, wherein individual said connecting pins and the through-hole of the sub-substrate through which the connecting pin is inserted are in elastic contact in the through-hole.

5. The probe card according to claim 1, wherein the space transformer includes a plurality of divided parts.

6. A probe card for examining semiconductor devices, comprising:
    a main substrate having first connecting electrodes adapted to be connected to a measuring device;
    a sub-substrate having through-holes having inner surfaces that are electrically conductive, said through-holes being electrically connected with respective said first connecting electrodes and at least indirectly coupled with said main substrate;
    a space transformer having a plurality of contacts adapted to contact a measuring object; and
    a plurality of electrically conductive connecting pins each connected at one end thereof to respective electrodes on said space transformer and having the other ends disposed in respective said through-holes in said sub-substrate and in electrical contact with the inner surfaces thereof;
    said electrodes on the space transformer being electrically connected to respective said contacts.

7. The probe card according to claim 6, wherein the sub-substrate and the space transformer are removably attached.

8. The probe card according to claim 7, wherein individual said connecting pins and the through-hole of the sub-substrate through which the connecting pin is inserted are in elastic contact in the through-hole.

9. The probe card according to claim 7, wherein the space transformer includes a plurality of divided parts.

10. The probe card according to claim 6, wherein
    the main substrate comprises a first main surface with the first connecting electrodes, and a second main surface with second connecting electrodes electrically connected with the first connecting electrodes via wires; and
    an electrical conductor for electrical connection is provided between the second main surface and a first main surface of the sub-substrate including the through-holes, said first main surface of the sub-substrate facing toward the second main surface of the main substrate.

11. The probe card according to claim 10, wherein a first main surface with the first connecting electrodes of the main substrate includes a reinforcing plate for preventing the distortion of the main substrate.

12. The probe card according to claim 10, wherein individual said connecting pins and the through-hole of the sub-substrate through which the connecting pin is inserted are in elastic contact in the through-hole.

13. The probe card according to claim 10, wherein the space transformer includes a plurality of divided parts.

14. The probe card according to claim 6, wherein a first main surface with the first connecting electrodes of the main substrate includes a reinforcing plate for preventing the distortion of the main substrate.

15. The probe card according to claim 14, wherein the space transformer includes a plurality of divided parts.

16. The probe card according to claim 6, wherein individual said connecting pins and the through-hole of the sub-substrate through which the connecting pin is inserted are in elastic contact in the through-hole.

17. The probe card according to claim 16, wherein the space transformer includes a plurality of divided parts.

18. The probe card according to claim 6, wherein the space transformer includes a plurality of divided parts.

* * * * *

UNITED STATES PATENT AND TRADEMARK OFFICE
CERTIFICATE OF CORRECTION

PATENT NO.        : 7,081,766 B2
APPLICATION NO. : 10/870017
DATED             : July 25, 2006
INVENTOR(S)       : Katsuhiko Satou et al.

It is certified that error appears in the above-identified patent and that said Letters Patent is hereby corrected as shown below:

Claim 2, Column 9, Line 34, after surface delete ","

Signed and Sealed this

Thirty-first Day of October, 2006

JON W. DUDAS
*Director of the United States Patent and Trademark Office*